United States Patent
Lobmeyer et al.

(10) Patent No.: US 9,410,262 B2
(45) Date of Patent: Aug. 9, 2016

(54) METHOD FOR PRODUCING A SILICON SINGLE CRYSTAL

(71) Applicant: Siltronic AG, Munich (DE)

(72) Inventors: Josef Lobmeyer, Bad Fuessing (DE); Georg Brenninger, Oberbergkirchen (DE); Waldemar Stein, Burghausen (DE)

(73) Assignee: SILTRONIC AG, Munich (DE)

( * ) Notice: Subject to any disclaimer, the term of this patent is extended or adjusted under 35 U.S.C. 154(b) by 383 days.

(21) Appl. No.: 13/969,818

(22) Filed: Aug. 19, 2013

(65) Prior Publication Data

US 2014/0060421 A1    Mar. 6, 2014

(30) Foreign Application Priority Data

Sep. 4, 2012 (DE) .......................... 10 2012 215 677

(51) Int. Cl.
  *C30B 13/08* (2006.01)
  *C30B 13/20* (2006.01)
  *C30B 29/06* (2006.01)
  *C30B 13/10* (2006.01)

(52) U.S. Cl.
  CPC ............. *C30B 13/20* (2013.01); *C30B 13/08* (2013.01); *C30B 13/10* (2013.01); *C30B 29/06* (2013.01)

(58) Field of Classification Search
  CPC .......... C30B 13/08; C30B 13/10; C30B 13/32
  See application file for complete search history.

(56) References Cited

U.S. PATENT DOCUMENTS

| | | | |
|---|---|---|---|
| 5,499,598 A * | 3/1996 | Oda | C30B 29/06 117/37 |
| 6,251,182 B1 | 6/2001 | Luna et al. | |
| 7,326,297 B2 * | 2/2008 | Abrosimov | C30B 13/20 117/18 |
| 2003/0145781 A1* | 8/2003 | Von Ammon | C30B 13/08 117/49 |
| 2011/0095018 A1 | 4/2011 | von Ammon et al. | |
| 2011/0107960 A1 | 5/2011 | von Ammon et al. | |
| 2013/0112134 A1* | 5/2013 | Spencer | C30B 15/20 117/13 |

FOREIGN PATENT DOCUMENTS

| | | |
|---|---|---|
| DE | 4416543 A1 | 11/1994 |
| DE | 10 2009 051 010 A1 | 5/2011 |
| JP | 09-142988 A | 6/1997 |
| JP | 2011-102234 A | 5/2011 |

* cited by examiner

*Primary Examiner* — Robert M Kunemund
(74) *Attorney, Agent, or Firm* — Brooks Kushman P.C.

(57) ABSTRACT

A silicon single crystal is produced by a method wherein
  a silicon plate is inductively heated;
  granular silicon is melted on the silicon plate; and
  the molten silicon thus produced flows through a flow conduit in the center of the plate to a phase boundary at which a silicon single crystal crystallizes, wherein a silicon ring having a lower resistivity than the plate, and lying on the plate, is inductively heated prior to inductively heating the plate, and melting the ring.

17 Claims, 1 Drawing Sheet

METHOD FOR PRODUCING A SILICON SINGLE CRYSTAL

CROSS-REFERENCE TO RELATED APPLICATIONS

This application claims priority to German Patent Application No. DE 10 2012 215 677.1 filed Sep. 4, 2012 which is herein incorporated by reference.

BACKGROUND OF THE INVENTION

1. Field of the Invention

The invention relates to a method for producing a silicon single crystal, comprising the following steps:
  inductive heating of a silicon plate;
  melting granular silicon on the silicon plate; and feeding the molten silicon through a flow conduit in the center of the plate to a phase boundary, at which a silicon single crystal crystallizes.

2. Description of the Related Art

A method for producing single crystal silicon by melting and crystallization of polycrystalline silicon granules, which will be abbreviated below as GFZ, is described for example in DE 10 2009 051 010 A1. It is a variant of the zone refining (floating zone method, FZ method), from which, however, there are particular differences. The material which is melted in the GFZ method and crystallized to produce a silicon single crystal is granular polycrystalline silicon, so-called granulate, while in the FZ method a feed rod of polycrystalline silicon is used. In order to melt the granular silicon and regulate the crystallization of the single crystal, separate induction heating coils are respectively used, while in the FZ method a common induction heating coil is provided for both tasks. Only in the GFZ method is it customary to use a plate on which the granulate is melted and fed in the molten state through a flow conduit in the center of the plate to the phase boundary, at which the silicon single crystal crystallizes.

In an initial phase of the GFZ method, the still obstructed flow conduit is partially melted from below so that a small volume of molten silicon, a melt drop, is formed. The energy required for melting the obstructed flow conduit is transmitted inductively from an induction heating coil arranged below the plate, the pulling coil. A seed crystal is placed from below on the melt drop and lowered further. At the phase boundary, which is formed at the contact of the seed crystal with the melt drop, after a phase of eliminating dislocations, a silicon single crystal crystallizes. The silicon required for the growth of the single crystal is initially provided only by melting the obstruction of the flow conduit, and later essentially by melting granulate on the plate and by feeding the resulting melt through the now open flow conduit to the phase boundary. The energy required for melting the granulate is transmitted inductively from an induction heating coil arranged above the plate, the melting coil, onto the plate and the granulate lying thereon.

Silicon is a semiconductor, which scarcely conducts an electrical current at room temperature. Correspondingly, inductive heating of silicon is only effective at comparatively high temperatures. In connection with the FZ method, DE 44 16 543 A1 proposes to facilitate the inductive coupling of silicon with an induction heating coil by preheating silicon by means of a susceptor to temperatures at which the electrical conductivity of silicon is much greater than at room temperature. However, the use of such a susceptor is not viable for the GFZ method because its presence would interfere with the crystallization of the single crystal.

The electrical conductivity of silicon at room temperature can be increased by doping the silicon with an electrically active dopant of the p type or n type. Examples of suitable dopants are in particular boron (p type) and phosphorus (n type). The plate can therefore already be heated inductively at room temperature, if it has a correspondingly high dopant concentration.

A disadvantage with the previously described process is that the dopant contained in the plate can pass uncontrolledly from the plate into the single crystal during the growth of the single crystal. Conventionally, however, it is desired that the single crystal and the semiconductor wafers produced therefrom have dopant concentrations which meet a predetermined specification and are not altered by uncontrolled influences.

SUMMARY OF THE INVENTION

It is therefore an object of the invention to provide a GFZ method which avoids such disadvantages. These and other objects are surprisingly and unexpectedly achieved by a process wherein the silicon plate is inductively heated, granular silicon is melted on the plate and fed through a central flow conduit, wherein a silicon ring having a lower resistivity than the plate is placed on the plate and melted by inductive heating.

DETAILED DESCRIPTION OF THE PREFERRED EMBODIMENT(S)

Figure 1:
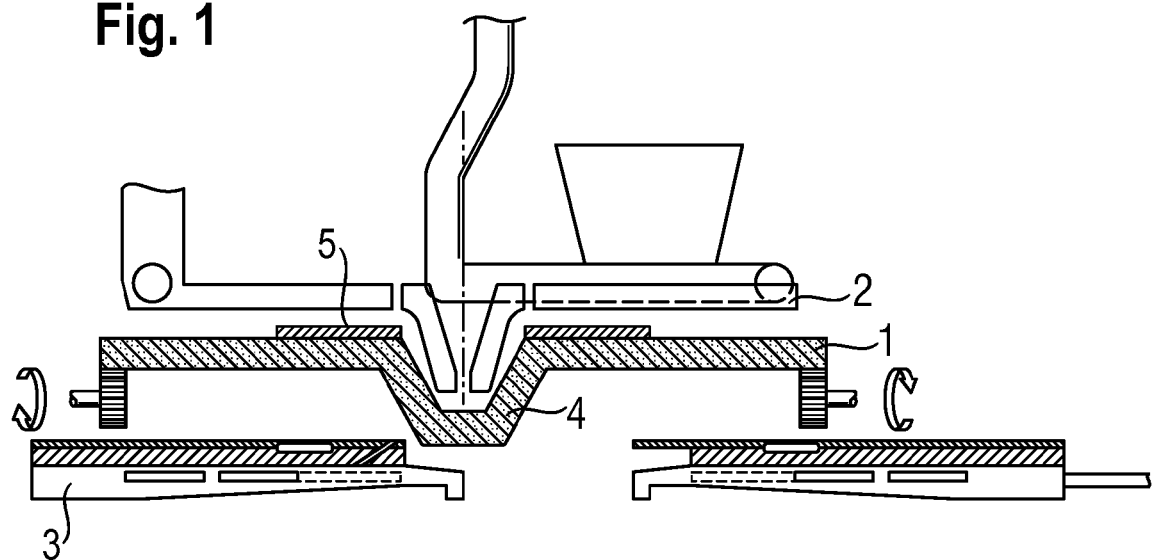
FIG. 1 shows an arrangement of device features which are suitable for carrying out the method according to the invention.
Figure 2:
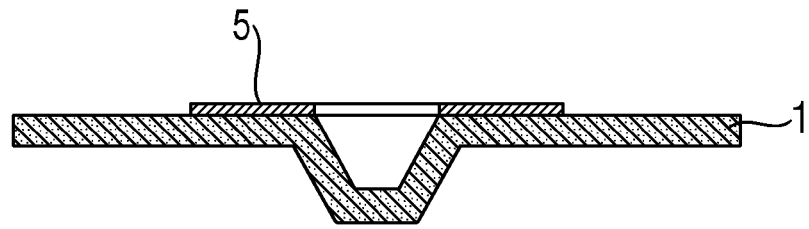
FIG. 2 is an enlarged view of one embodiment of a silicon plate and silicon ring having lower resistivity than the silicon plate.

The invention thus relates to a method for producing a silicon single crystal, comprising
  inductive heating of a silicon plate;
  melting granular silicon on the silicon plate; and
  feeding the molten silicon through a flow conduit in the center of the plate to a phase boundary, at which a silicon single crystal crystallizes, characterized by inductive heating of a silicon ring before the inductive heating of the plate, the ring lying on the plate and having a lower resistivity than the plate; and
  melting the ring.

The electrically conductive ring is able to couple with the induction heating coil even at room temperature. A part of the heat produced in the ring is transmitted by thermal transfer to the plate, so that the latter quickly reaches the temperature for effective coupling with the induction heating coil. The ring is finally fully melted and fed in the molten state, with the dopant contained in it, through the flow conduit to the growing single crystal, and finally crystallized as a comparatively small component of the single crystal. The dopants contained in the ring are therefore bound and cannot enter the main part of the single crystal, which is subsequently formed by melting granulate and crystallizing the molten granulate at the phase boundary.

The plate does not contain any electrically active dopants, or is doped comparatively lightly. The resistivity of the ring is preferably less than the resistivity of the plate by not less than 90%. A ring resistivity of not more than 80 mΩcm and a plate resistivity of not less than 1 Ωcm are particularly preferred.

The ring is dimensioned smaller than the plate. The outer diameter of the ring is preferably less than the outer diameter of the plate by not less than 40%. The inner diameter of the ring preferably corresponds to the length of the inner diameter of the flow conduit of the plate. The thickness of the ring is preferably less than the thickness of the plate by not less than 80%.

The ring is preferably cut from a single crystal which has been produced by the GFZ method or the FZ method. The plate is likewise preferably cut from a single crystal which has been produced by the GFZ method or the FZ method.

In addition to what is known for example from DE 10 2009 051 010 A1, a ring 5 is shown which is placed on a plate 1 and inductively heated with the aid of an upper induction heating coil 2, which is arranged above the plate 1. A point in time is displayed which lies before the generation of a melt drop at the lower end of a flow conduit 4 of the plate 1 with the aid of a lower induction heating coil 3.

EXAMPLE AND COMPARATIVE EXAMPLE

A silicon single crystal was produced according to the invention by using a device having the features shown in FIG. 1.

A silicon ring was placed on the silicon plate, which had an outer diameter of 150 mm and a thickness of 7 mm. The outer diameter of the ring was 75 mm, the inner diameter 35 mm and the thickness of the ring was 0.7 mm. The ring was doped with electrically active dopant and had a resistivity of 20 mΩcm. The resistivity of the plate was 60 Ωcm.

Initially, the heavily doped ring was heated with the aid of the upper induction coil, and heat was transmitted from the heated ring to the underlying plate. After the plate had reached a temperature of approximately 600° C., it was possible to inductively heat the plate directly within a few minutes to a temperature in the range of the melting temperature of silicon, and carry out the GFZ method.

For comparison, the GFZ method was carried out without a ring, but with a heavily doped plate whose resistivity was 30 mΩcm.

A study of the axial profile of the resistivity of the single crystals produced revealed a much more homogeneous profile, lying closer to the specified resistance, for the single crystal which was produced according to the invention.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method for producing a silicon single crystal, comprising
    inductively heating a silicon plate having an outer diameter;
    melting granular silicon on the silicon plate; and
    feeding molten silicon through a flow conduit having an inner diameter and located in the center of the plate, to a phase boundary, crystallizing molten silicon at the phase boundary to form a silicon single crystal, wherein
    a silicon ring lying on the plate and having a lower resistivity than the plate and having an inner and an outer diameter is inductively heated before inductively heating the plate, and
    melting the ring.

2. The method of claim 1, wherein the ring has a resistivity of not more than 80 mΩcm.

3. The method of claim 1, wherein the plate has a resistivity of not less than 1 Ωcm.

4. The method of claim 2, wherein the plate has a resistivity of not less than 1 Ωcm.

5. The method of claim 1, wherein the outer diameter of the ring is less than the outer diameter of the plate.

6. The method of claim 2, wherein the outer diameter of the ring is less than the outer diameter of the plate.

7. The method of claim 3, wherein the outer diameter of the ring is less than the outer diameter of the plate.

8. The method of claim 4, wherein the outer diameter of the ring is less than the outer diameter of the plate.

9. The method of claim 1, wherein the inner diameter of the ring is the same as the inner diameter of the flow conduit.

10. The method of claim 2, wherein the inner diameter of the ring is the same as the inner diameter of the flow conduit.

11. The method of claim 3, wherein the inner diameter of the ring is the same as the inner diameter of the flow conduit.

12. The method of claim 5, wherein the inner diameter of the ring is the same as the inner diameter of the flow conduit.

13. The method of claim 1, wherein the thickness of the ring is less than the thickness of the plate.

14. The method of claim 2, wherein the thickness of the ring is less than the thickness of the plate.

15. The method of claim 3, wherein the thickness of the ring is less than the thickness of the plate.

16. The method of claim 5, wherein the thickness of the ring is less than the thickness of the plate.

17. The method of claim 9, wherein the thickness of the ring is less than the thickness of the plate.

* * * * *